(12) United States Patent
Beurdeley et al.

(10) Patent No.: US 12,013,717 B2
(45) Date of Patent: Jun. 18, 2024

(54) HUMAN-MACHINE INTERFACE

(71) Applicant: CROUZET, Valence (FR)

(72) Inventors: Damien Beurdeley, Valence (FR); Hervé Carton, Valence (FR); Céline Molmeret, Valence (FR); Adrien Dussere, Valence (FR)

(73) Assignee: CROUZET, Valence (FR)

( * ) Notice: Subject to any disclaimer, the term of this patent is extended or adjusted under 35 U.S.C. 154(b) by 0 days.

(21) Appl. No.: 17/995,382

(22) PCT Filed: Mar. 15, 2021

(86) PCT No.: PCT/EP2021/056469
§ 371 (c)(1),
(2) Date: Oct. 3, 2022

(87) PCT Pub. No.: WO2021/197814
PCT Pub. Date: Oct. 7, 2021

(65) Prior Publication Data
US 2023/0168706 A1    Jun. 1, 2023

(30) Foreign Application Priority Data

Apr. 3, 2020  (FR) .................................. FR2003361

(51) Int. Cl.
*G05G 5/05*           (2006.01)
*G05G 9/047*          (2006.01)
(Continued)

(52) U.S. Cl.
CPC ........... *G05G 5/05* (2013.01); *G05G 9/04796* (2013.01); *H01H 5/02* (2013.01); *H01H 23/30* (2013.01);
(Continued)

(58) Field of Classification Search
CPC ................. G05G 5/05; G05G 9/04796; G05G 2009/04707; G05G 2009/04722;
(Continued)

(56) References Cited

U.S. PATENT DOCUMENTS 3,394,611 A    7/1968  Beurrier
3,828,148 A    8/1974  Roeser
(Continued)

FOREIGN PATENT DOCUMENTS

CN    101809334 A  *  8/2010  ........... F16H 59/044
CN    110869231 B  *  1/2023  ............ B60K 20/02
(Continued)

OTHER PUBLICATIONS

International Search Report for International Application No. PCT/EP2021/056469, dated Jun. 11, 2021, 6 pages with English translation.
(Continued)

*Primary Examiner* — Ricardo Osorio
(74) *Attorney, Agent, or Firm* — TraskBritt

(57) ABSTRACT

A human-machine interface comprising: —a magnetic rocker rotatably movable between a rest position wherein an implement is maintained in a neutral position and a tilted position wherein the implement is in a reclined position, —a magnetic assembly, attached to a frame, capable of cooperating with the magnetic rocker to generate a magnetic return force that constantly urges the magnetic rocker towards its rest position, —a sliding connection comprising a flange and a slide, and —the implement comprises one of the slides, and the flange and the magnetic rocker comprise the other of the slide and the flange such that the sliding connection transforms the movement of the implement towards the reclined position by moving the magnetic rocker towards its tilted position and vice versa.

12 Claims, 6 Drawing Sheets

(51) Int. Cl.
*H01H 5/02* (2006.01)
*H01H 23/30* (2006.01)

(52) U.S. Cl.
CPC .............. *G05G 2009/04707* (2013.01); *G05G 2009/04722* (2013.01); *H01H 2221/04* (2013.01)

(58) Field of Classification Search
CPC ...................... G05G 1/04; G05G 9/047; G05G 2009/04711; G05G 2009/04766; H01H 5/02; H01H 23/30; H01H 2221/04; H01H 25/04; H03K 17/97; H03K 2217/96062
See application file for complete search history.

(56) References Cited

U.S. PATENT DOCUMENTS

| | | |
|---|---|---|
| 2002/0190945 A1 | 12/2002 | Arita et al. |
| 2010/0288071 A1* | 11/2010 | Klossek ................. G05G 5/05 74/519 |
| 2018/0173310 A1 | 6/2018 | Geis |
| 2019/0179357 A1 | 6/2019 | Sirohiwala et al. |
| 2019/0285170 A1* | 9/2019 | Igarashi .................. F16H 61/24 |
| 2020/0272193 A1* | 8/2020 | Battlogg ................. G05G 5/03 |
| 2023/0031876 A1* | 2/2023 | Battlogg ................ G05G 25/00 |

FOREIGN PATENT DOCUMENTS

| | | | |
|---|---|---|---|
| EP | 2891835 A1 * | 7/2015 | ........... F16H 59/105 |
| EP | 2891835 A1 | 7/2015 | |
| FR | 2632770 A1 | 12/1989 | |
| GB | 2331850 A | 6/1999 | |
| JP | 2005-183081 A | 7/2005 | |
| JP | 2011510386 A * | 3/2011 | |
| WO | 2015/150439 A2 | 10/2015 | |

OTHER PUBLICATIONS

International Written Opinion for International Application No. PCT/EP2021/056469, dated Jun. 11, 2021, 10 pages with English machine translation.

* cited by examiner

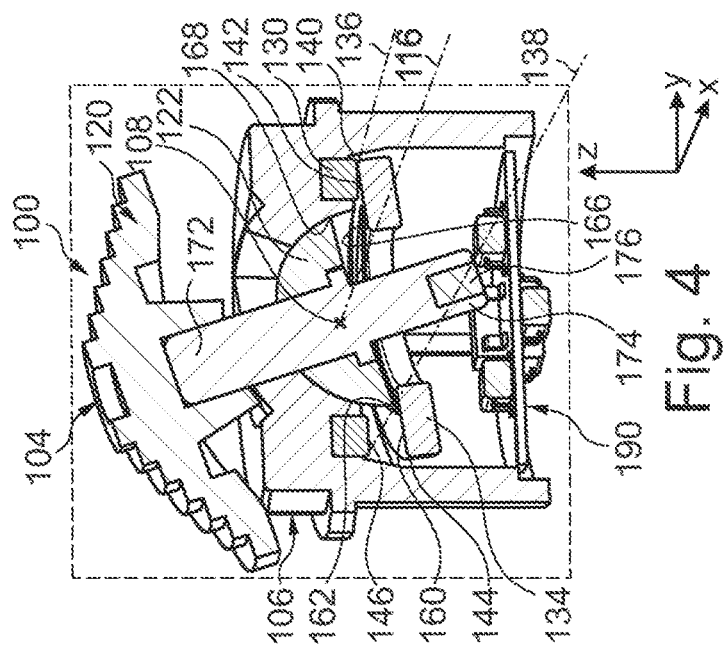
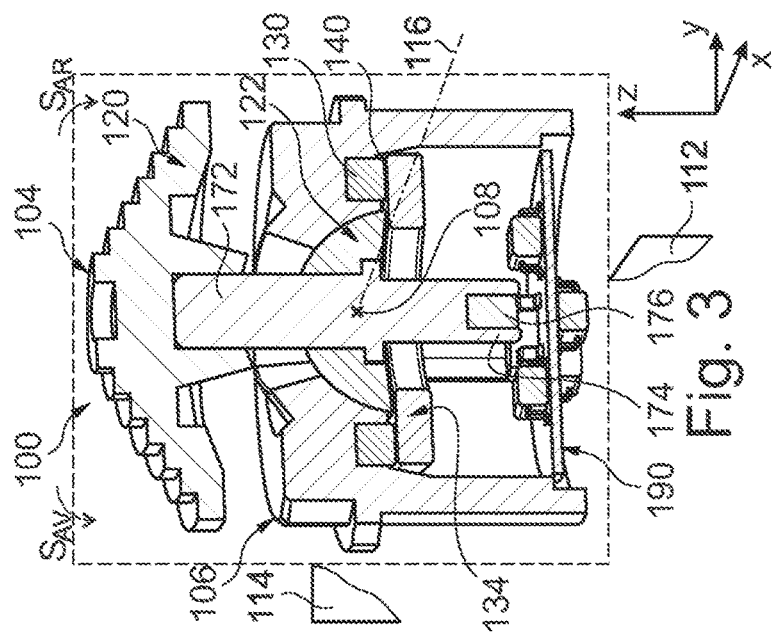
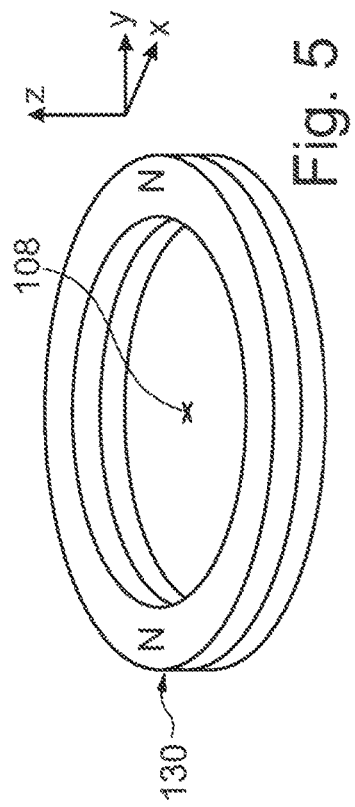

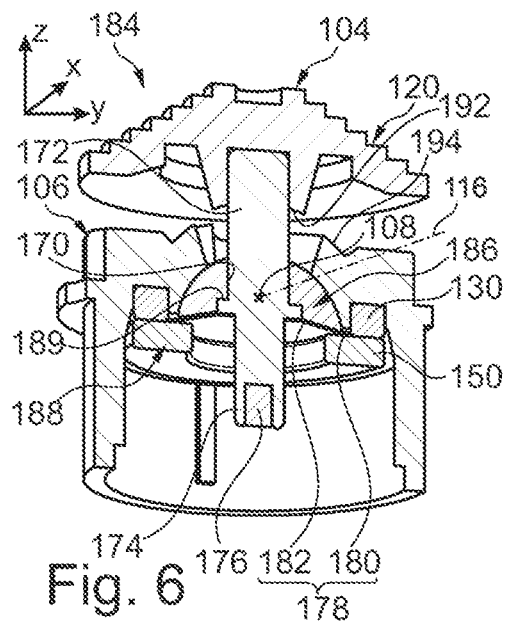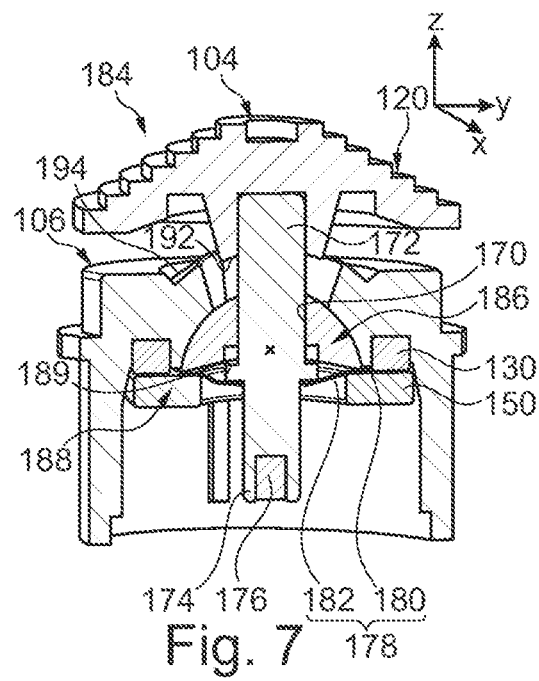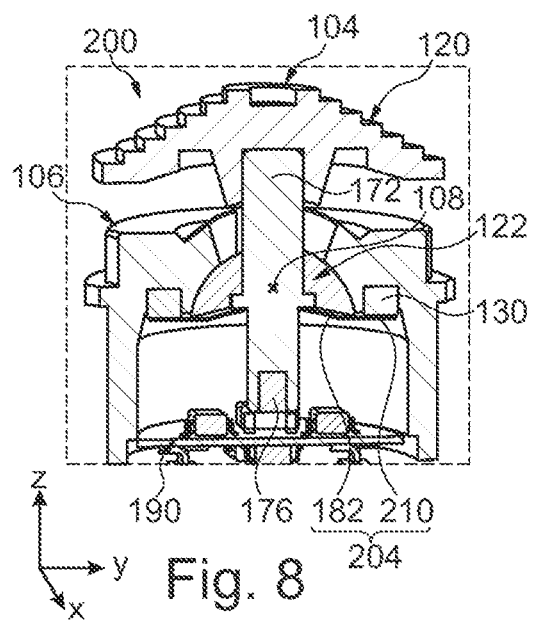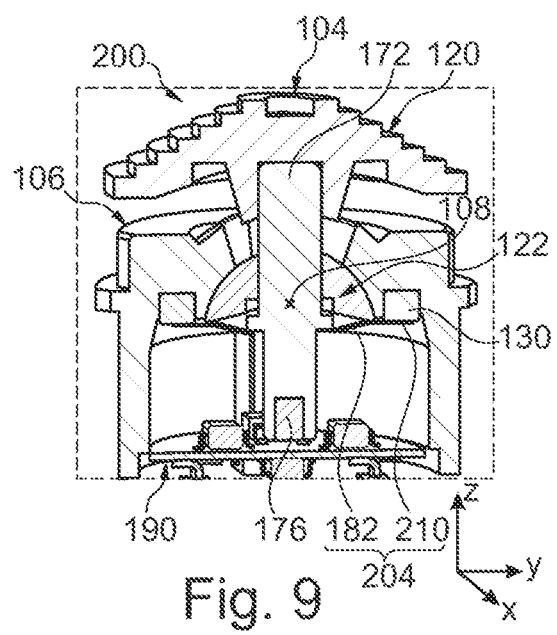

HUMAN-MACHINE INTERFACE

CROSS-REFERENCE TO RELATED APPLICATIONS

This application is a national phase entry under 35 U.S.C. § 371 of International Patent Application PCT/EP2021/056469, filed Mar. 15, 2021, designating the United States of America and published as International Patent Publication WO 2021/197814 A1 on Oct. 7, 2021, which claims the benefit under Article 8 of the Patent Cooperation Treaty to French Patent Application Serial No. FR2003361, filed Apr. 3, 2020.

TECHNICAL FIELD

The disclosure relates to a human-machine interface.

BACKGROUND

Human-machine interfaces typically comprise:
a fixed frame;
an implement rotatably movable by a user in a first direction, about a first axis, from a neutral position to a first inclined position, the neutral position being the position of the implement without any external urging of this implement; and
a return mechanism, which constantly urges the implement to its neutral position, this return mechanism comprising a magnetic assembly comprising one or more magnetic part(s) each attached to the frame.

For example, such human-machine interfaces are known from US 2019/179357 A1 and US 2018/173310 A1. Human-machine interfaces are also known from U.S. Pat. No. 3,828,148 A, JP 2005/183081 A and EP 2891835.

These human-machine interfaces are used to acquire data transmitted by the user by manipulating the implement. Then, the acquired data are transmitted to an electronic device, which, in response, controls an electric actuator or a screen.

Such human-machine interfaces can be used in environments that experience vibrations. This is typically the case when such a human-machine interface is used in a vehicle such as an aircraft, a motor vehicle or the like.

In these environments, these human-machine interfaces must be vibration-resistant. In particular, the implement must not or practically must not oscillate around its neutral position in response to these vibrations.

Furthermore, these human-machine interfaces must maintain a low spatial requirement and remain simple to manufacture.

BRIEF SUMMARY

Embodiments of the disclosure aim to provide a human-machine interface suitable for use in an environment where it can experience vibrations. It, therefore, relates to such a human-machine interface as claimed in the independent claim herein.

BRIEF DESCRIPTION OF THE DRAWINGS

Embodiments of the disclosure will be better understood upon reading the following description, which is provided solely by way of a non-limiting example and with reference to the drawings, in which:

FIGS. 3, 4, 6 and 7 are schematic illustrations, as perspective and vertical section views, of a second embodiment of a human-machine interface;

FIG. 5 is an illustration, as a perspective view, of a magnetized ring used in the human-machine interface of FIGS. 3, 4, 6 and 7;

FIGS. 8 and 9 are schematic illustrations, as perspective and vertical section views, of a third embodiment of a human-machine interface;

In these figures, the same reference signs are used to denote the same elements. Throughout the remainder of this description, any features and functions that are well known to a person skilled in the art are not described in detail.

DETAILED DESCRIPTION

In this description, detailed examples of embodiments are firstly described in chapter I with reference to the figures. Then, in the following chapter, chapter II, alternative embodiments of these embodiments are presented. Finally, the advantages of the various embodiments are presented in chapter III.

Chapter I: Embodiments

Figure 1:
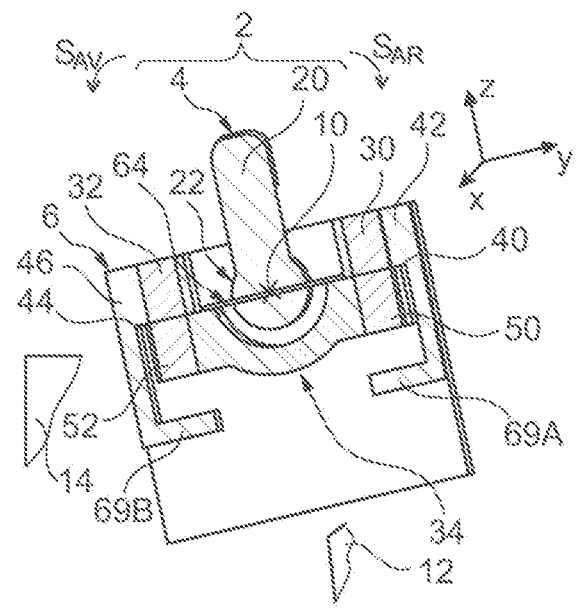
FIGS. 1 and 2 are schematic illustrations, as perspective and vertical section views, of a first embodiment of a human-machine interface.
Figure 2:
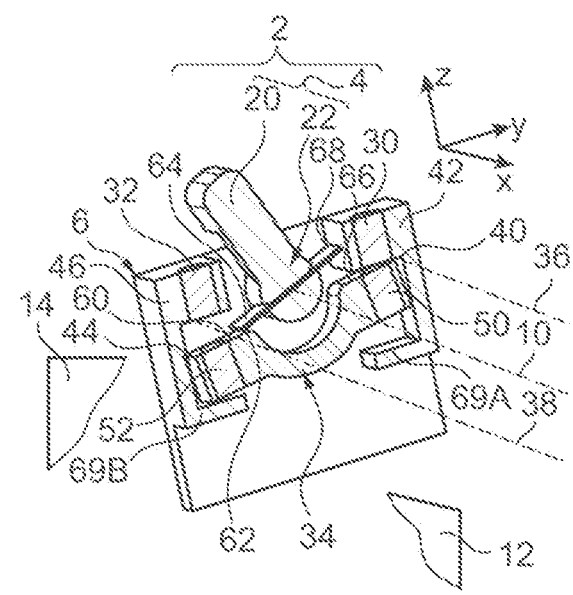

FIGS. 1 and 2 show a human-machine interface 2 comprising an implement 4 rotatably mounted inside a frame 6. In this case, the implement 4 is a lever. The implement 4 is only rotatably mounted about a single axis 10. The axis 10 is parallel to an X-direction of an orthogonal XYZ reference frame. The axis 10 is attached to the frame 6 without any degree of freedom.

In this XYZ reference frame, the X- and Y-directions are horizontal and the Z-direction is vertical. Hereafter, terms such as "top," "bottom," "upper," "lower" and the like are defined relative to the vertical Z-direction. The terms "left" and "right" are defined relative to the Y-direction and to a vertical median plane 12 of the interface 2. Thus, the term "right" denotes what is found to the right of the plane 12 when the Y-direction points to the right. The plane 12 contains the axis 10. Hereafter, the XYZ reference frame is used to orient each of the figures.

In this particular embodiment, in a neutral position shown in FIG. 1, the interface 2 is symmetrical relative to the plane 12. In addition, the interface 2 is also symmetrical relative to a vertical plane 14 perpendicular to the plane 12. Thus, hereafter, only the elements of the interface 2 located on one side of the plane 12 and behind the plane 14 are described in detail. The other elements are deduced by symmetry relative to these planes 12 and 14.

The neutral position is the position of the implement 4 without any external urging.

From the neutral position, the implement 4 is rotatably movable by the user about the axis 10 in a forward direction $S_{AV}$ and, alternately, in a backward direction $S_{AR}$. For example, the user moves the implement 4 directly with their hand or with a finger. The forward $S_{AV}$ and backward $S_{AR}$ directions are shown by arrows respectively identified using the $S_{AV}$ and $S_{AR}$ symbols in FIG. 1. In this case, the direction $S_{AV}$ is the anticlockwise direction and the direction $S_{AR}$ is the clockwise direction.

The implement 4 pivots, in the direction $S_{AV}$, from the neutral position to a left inclined position shown in FIG. 2. The implement 4 is also capable of pivoting, in the direction $S_{AR}$, from the neutral position to a right inclined position. Typically, the right inclined position is the image of the left inclined position relative to the plane 12. The angular offset $\alpha_{AV}$ between the neutral position and the left-most inclined position in this case ranges between 2° and 500 or between 2° and 45° or between 5° and 45°.

The implement 4 comprises a gripping handle 20 accessible from outside the frame 6 so as to be directly hand operated by the user. In the neutral position, this handle 20 extends vertically and upward from a cylindrical body 22. The body 22 is rotatably mounted on the axis 10.

The interface 2 comprises a return mechanism that constantly urges the implement 4 to its neutral position. The return mechanism comprises a magnetic assembly attached to the frame 6 without any degree of freedom. This magnetic assembly comprises one or more magnetic part(s). In this application, "magnetic part" denotes both a permanent magnet and a non-permanently magnetized magnetic part. The term "non-permanently magnetized magnetic part" denotes a magnetic part that is not permanently magnetized, but that is magnetized when it is placed inside a magnetic field of a permanent magnet. Such a non-permanently magnetized magnetic part is therefore attracted by a permanent magnet when it is located in the vicinity of the permanent magnet. Typically, the non-permanently magnetized magnetic parts are parts made of a ferromagnetic material, such as a ferromagnetic metal. For example, in this case, the non-permanently magnetized parts are made of steel.

In this first embodiment, the magnetic assembly comprises two permanent magnets 30 and 32. The magnet 30 is to the right of the plane 12. The magnetic moment of this magnet 30 is vertical. The magnet 30 comprises a south pole facing downward and a north pole facing upward.

The return mechanism also comprises a magnetic rocker 34 rotatably movable about an axis 36 (FIG. 2) and, alternately, about an axis 38 (FIG. 2). The axes 36 and 38 are parallel to the axis 10 and separate from the axis 10. They are fixed relative to the frame 6. In this case, the axis 38 is the image of the axis 36 relative to the plane 12.

More specifically, the rocker 34 is movable by pivoting, about the axis 36 in the direction $S_{AV}$, from a rest position, shown in FIG. 1, to a left tilted position shown in FIG. 2. It is also movable by pivoting, about the axis 38 in the reverse direction $S_{AR}$, from the rest position to a right tilted position. The right tilted position is the image, relative to the plane 12, of the left tilted position shown in FIG. 2.

In the rest position, the rocker 34 holds the implement 4 in its neutral position. In its left tilted position, the implement 4 is in its left inclined position (FIG. 2). In its right tilted position, the implement 4 is in its right inclined position.

In order to pivot about the axis 36, the rocker 34 comprises an abutment point 40 that is movable between an active position and a remote position. In this embodiment, the abutment point 40 is formed by an upper corner of the rocker 34. In the active position, the point 40 is directly in mechanical abutment against a stop 42 of the frame 6. In this active position, the point 40 is located on the axis 36 and forms, by cooperation of shapes with the stop 42, an articulation that allows the rocker 34 to pivot about the axis 36. In the remote position, the point 40 is no longer in mechanical contact with the stop 42.

The images of the point 40 and of the stop 42 relative to the plane 12 respectively use reference numerals 44 and 46. The point 44 and the stop 46 function and fulfil the same functions as the point 40 and the stop 42, but in order to allow the rocker 34 to pivot about the axis 38.

The rocker 34 also cooperates with the magnets 30 and 32 in order to generate the return force that constantly urges the implement 4 to its neutral position. In this case, the return force is generated by magnetic attraction between the rocker 34 and the magnets 30 and 32. To this end, the rocker 34 comprises two permanent magnets 50 and 52. The magnet 50 is located to the right of the plane 12. The magnetic moment of the magnet 50 is vertical. The magnet 50 comprises a south pole and a north pole. The north pole of the magnet 50 faces upward in the rest position. In the rest position, this north pole is located facing the south pole of the magnet 30. In this case, in the rest position, the north pole of the magnet 50 is adhered to the south pole of the magnet 30. Thus, without any external urging, the rocker 34 returns to its rest position.

When the rocker 34 moves between its rest position and its left tilted position, the point 40 is held in its active position by the magnetic attraction force between the magnets 30, 32 and the magnets 50 and 52. At the same time, in this situation, the point 44 is in its remote position.

Similarly, when the rocker 34 moves between its rest position and its right tilted position, the point 44 is held in its active position by the magnetic attraction force between the magnets 30, 32 and the magnets 50, 52. In this case, the point 40 is in its remote position.

Finally, the return mechanism also comprises a sliding connection between the implement 4 and the rocker 34. This sliding connection comprises a left part located to the left of the plane 12. The left part of the sliding connection comprises a flat spot 60 (FIG. 2) and a slide 62 (FIG. 2). In this case, the flat spot 60 extends in a direction perpendicular to the axis 10. In the rest position, this direction is horizontal. This left part converts a movement of the implement 4 from its neutral position to its left inclined position, into a movement of the rocker 34 from its rest position to its left tilted position. This left part of the sliding connection also converts a movement of the rocker 34 from its left tilted position to its rest position into a movement of the implement 4 from its left inclined position to its neutral position.

To this end, the slide 62 slides along the flat spot 60 when the implement 4 is moved between the neutral position and the left inclined position. The slide 62 is also in abutment on the flat spot 60 in the neutral position of the implement 4. The slide 62 is located at least 1 mm or 3 mm from the axis 10 and, in some embodiments, more than 5 mm or 10 mm from the axis 10. The slide 62 is attached to the implement 4 without any degree of freedom. In this embodiment, the slide 62 is formed by a left-hand edge of a leaf 64. The leaf 64 is attached to the body 22. In the neutral position, the leaf 64 extends horizontally.

This sliding connection also comprises a right part that is the image of the left part relative to the plane 12 in the neutral position. This right part converts a movement of the implement 4 from its neutral position to its right inclined position into a movement of the rocker 34 from its rest position to its right tilted position. This right part of the sliding connection also converts a movement of the rocker 34 from its right tilted position to its rest position into a movement of the implement 4 from its right inclined position to its neutral position.

The images of the flat spot 60 and of the slide 62 relative to the plane 12 respectively use reference numerals 66 and 68 (FIG. 2).

The frame 6 also comprises, in this embodiment, two stops 69A and 69B respectively located to the right and to the left of the plane 12 and symmetrical with one another relative to this plane. The stop 69B limits the angular travel of the rocker 34 when it rotates about the axis 36 in the direction $S_{AV}$.

The operation of the interface 2 is as follows. Without any external urging, the return force exerted by the magnets 30, 32 and the magnets 50, 52 holds the rocker 34 in its rest position. In the rest position, the slides 62 and 68 are simultaneously in abutment against the flat spots 60 and 66 and are remote from the axis 10. The leaf 64 therefore holds the implement 4 in its neutral position. The torque required to move the implement 4 to one of its inclined positions is therefore high.

When a user pushes the handle 20 in the direction $S_{AV}$, the implement 4 moves from its neutral position to the left inclined position. More specifically, in this embodiment, the leaf 64 initially bends to the left-hand side before the rocker begins to rotate about the axis 36. Then, the rotation of the implement 4 is converted, by the sliding connection, into a rotation of the rocker 34 from its rest position to its left tilted position. In this case, in the left tilted position, the rocker 34 is in abutment against the stop 69B. The rotation of the rocker 34 in the direction $S_{AV}$ is then blocked. However, in this embodiment, by increasing the pushing force on the handle 20, the leaf 64 bends again, which allows the user to continue the rotational movement about the axis 10 and in the direction $S_{AV}$ of the implement 4, until this implement comes into abutment on a rim of the frame 6. Thus, in this embodiment, in order to go beyond the left inclined position shown in FIG. 2, the user must increase their pushing force.

When the user releases the force that they exerted on the implement 4, the implement 4 is no longer subjected to any external urging. The return force generated by the magnets 30, 32 and 50, 52 then returns the rocker 34 to its rest position. The left part of the sliding connection converts this overrunning of the rocker 34 into the movement of the implement 4 from its left inclined position to its neutral position.

The operation of the interface 2 when the implement 4 is moved by a user from its neutral position to its right inclined position is deduced from the above explanations.

At the same time as these movements, sensors, not shown in FIGS. 1 and 2, continuously measure the angular position of the implement 4 about the axis 10. The data acquired by these sensors are transmitted to a control device that controls one or more electric actuator(s) or screen(s) as a function of the acquired data.

FIGS. 3 and 4 show a human-machine interface 100 that assumes the main operating principles of the interface 2 but in the case of a joystick.

The interface 100 comprises an implement 104 rotatably mounted inside a frame 106. The implement 104 is a lever. The implement 104 is mechanically connected to the frame 106 by a ball-joint connection. Thus, it is rotatably mounted about an infinite number of horizontal axes of rotation all intersecting at a point 108, which hereafter is called "center 108 of rotation." The center 108 is attached to the frame 106 without any degree of freedom.

In a neutral position, shown in FIG. 3, the interface 100 is symmetrical relative to a vertical plane 112 passing through the center 108. In addition, the interface 100 is also symmetrical relative to a vertical plane 114 perpendicular to the plane 12 and passing through the center 108. Thus, as before, only the elements of the interface 100 located on one side of the plane 112 and behind the plane 114 are described in detail. The other elements are deduced by symmetry relative to these planes 112 and 114. In addition, the remainder of the description is provided in the particular case whereby the implement 104 pivots about an axis 116 parallel to the direction X and passing through the center 108. The description in this particular case applies to any axis passing through the center 108 and about which the implement 104 can pivot. In this particular case, the plane 112 contains the axis 116.

The implement 104 pivots, about the axis 116 and in the direction $S_{AV}$, from the neutral position to a left inclined position shown in FIG. 4. The implement 104 is also capable of pivoting, about the axis 116 in the direction $S_{AR}$, from the neutral position to a right inclined position. Typically, the right inclined position is the image of the left inclined position relative to a plane 112. The angular offset $\alpha_{AV}$ between the neutral position and the left-most inclined position in this case ranges between 2° and 50° or between 210 and 45° or between 5° and 45°.

The implement 104 comprises a gripping handle 120 accessible from outside the frame 6 so as to be directly hand activated by the user, for example. This handle 120 projects beyond the frame 106. The handle 120 is mechanically connected to a hemispherical body 122 by a shaft 172. In this embodiment, the shaft 172 is attached to the body 122 without any degree of freedom. The body 122 is rotatably mounted in the frame 106 by means of a ball-joint connection.

The interface 100 comprises a return mechanism that constantly urges the implement 104 to its neutral position. This return mechanism comprises a magnetic assembly attached to the frame 106 without any degree of freedom. In this embodiment, the magnetic assembly comprises a magnetized ring 130, the axis of rotation of which is vertical and passes through the center 108. This ring 130 is shown on its own in FIG. 5. The magnetic moment of this ring 130 is vertical. It comprises a south pole facing downward and a north pole facing upward.

The return mechanism comprises a magnetic rocker 134 rotatably movable about an axis 136 (FIG. 4) and, alternately, about an axis 138 (FIG. 4). The axes 136 and 138 are parallel to the axis 116 and separate from the axis 116. They are also attached to the frame 106 without any degree of freedom. The axis 138 is symmetrical to the axis 136 relative to the plane 112.

More specifically, the rocker 134 is movable, by pivoting about the axis 136 in the direction $S_{AV}$, from a rest position shown in FIG. 3 to a left tilted position shown in FIG. 4. The rocker 134 is also movable, by pivoting about the axis 138 in the direction $S_{AR}$, from the rest position to a right tilted position. The right tilted position is the image, relative to the plane 112, of the left tilted position shown in FIG. 4.

In the rest position, the rocker 134 holds the implement 104 in its neutral position. In the left tilted position of the rocker 134, the implement 104 is in its left inclined position. In its right tilted position, the implement 104 is in its right inclined position. In order to pivot about the axis 136, the rocker 134 comprises an abutment point 140 that can be moved between an active position and a remote position. In the active position, the point 140 is directly in mechanical abutment against a stop 142 of the frame 106. This active position of the point 140 is obtained when the rocker 134 is tilted to the left. In this embodiment, the stop 142 is formed by a lower face of the ring 130. The operation of the abutment point 140 and of the stop 142 is identical to that of the point 40 and of the stop 42 described in the case of the interface 2. The image of the point 140 and of the stop 142 relative to the plane 112 respectively use reference numerals 144 and 146.

The rocker 134 cooperates with the ring 130 in order to generate the return force that constantly urges the implement 104 to its neutral position. As in the case of the interface 2, the return force is generated by magnetic attraction between the rocker 134 and the ring 130.

To this end, in this embodiment, the rocker 134 is in the form of a washer made of a non-permanently magnetized magnetic material. In the rest position, the axis of rotation of the rocker 134 coincides with the axis of rotation of the ring 130. Thus, the rocker 134 concentrates and guides the field lines of the ring 130. Consequently, in the presence of the ring 130, the rocker 134 acquires magnetization and then has a north pole facing the south pole of the ring 130. In this case, in the rest position, the north pole of the rocker 134 is directly pressed against the south pole of the ring 130. Without any external urging, the rocker 134 therefore returns to its rest position.

In this case, the points 140 and 144 are diametrically opposite points of an upper edge of the rocker 134.

As in the case of the interface 2, the points 140 and 144 are held in their respective active position by the force of magnetic attraction between the ring 130 and the washer 150. Thus, the same elements of the interface 100 as those used to generate the return force of the implement 4 to its neutral position are also used to hold the point 140 and, alternately, the point 144 in its active position.

The return mechanism also comprises a sliding connection between the implement 104 and the rocker 134. As in the interface 2, this sliding connection comprises a left part and a right part respectively located to the left and to the right of the plane 112. The left part of the sliding connection comprises a flat spot 160 and a slide 162. The slide 162 is formed by a point of a lower edge of the body 122. The images of the flat spot 160 and of the slide 162 relative to the plane 112 respectively use the same reference numerals 166 and 168 (FIG. 4). This sliding connection operates exactly like the sliding connection described in the case of the interface 2. Thus, it is not described in greater detail in this case.

The upper end of the shaft 172 is mechanically connected to the handle 120. A lower end 174 of the shaft 172 is located below the rocker 134. To this end, the shaft 172 passes through the central orifice of the rocker 134. This lower end 174 comprises a permanent magnet 176.

The interface 100 also comprises an electronic board 190 (FIGS. 3 and 4) equipped with one or more sensor(s) capable of measuring the magnetic field generated by the magnet 176. The board 190 also comprises an electronic computer capable of establishing the angular position of the implement 104 around the center 108 on the basis of the measurements of these sensors. The board 190 also comprises a transmitter capable of transmitting the established angular position.

The operation of the interface 100 is deduced from the explanations provided in the case of the interface 2, except that, in this case, the implement 104 also can be rotatably moved by the user about any horizontal axis passing through the center 108.

FIGS. 6 to 7 show an interface 184 identical to the interface 100 except that, in addition, the handle 120 is vertically translatable, by the user, between a released position, shown in FIG. 6, and a depressed position shown in FIG. 7. Thus, in this embodiment, the handle 120 also acts as a pusher. To this end, the body 122 and the rocker 134 are replaced by a body 186 and a rocker 188, respectively.

The body 186 is identical to the body 122, except that it also comprises a casing 170. In the neutral position, the casing 170 extends along a vertical axis passing through the center 108. For example, the casing 170 is a hole completely passing through the body 186. The shaft 172 of the implement 104 is slidably received inside the casing 170.

The rocker 188 comprises a washer 150 and a leaf spring 178, which constantly urges the handle 120 to its released position. The washer 150 is identical to the rocker 134.

In this embodiment, the leaf spring 178 is cup-shaped with a flat circular periphery 180 and a central boss 182. The circular periphery 180 is in abutment on an upper face of the washer 150. The boss 182 is completely passed through by the shaft 172. The central boss 182 is in abutment on a shoulder 189 of the shaft 172. More specifically, in the neutral position and without any external urging, the leaf spring 178 exerts a pushing force $F_p$ in order to hold the handle 120 in its released position. The force $F_p$ is vertical and directed upward. The amplitude of the force $F_p$ is less than the amplitude of the return force $F_r$ generated by the magnetized ring 130 and the washer 150 in the neutral position. Thus, when a user exerts a downward vertical force on the handle 120 with an amplitude ranging between the amplitudes of the forces $F_p$ and $F_r$, the handle 120 moves from its released position to its depressed position without the rocker 188 moving. As soon as the user releases the handle 120, the leaf spring 178 returns it to its released position. For example, the leaf spring 178 is made of a non-magnetic material.

The handle 120 in this case comprises a hemispherical bearing face 192 (FIGS. 6 and 7), which slidably comes into abutment, for example, as shown in FIG. 4, on a corresponding upper bearing face 194 of the frame 106 when the implement 104 is in any one of its inclined positions. Thus, in the inclined positions, the handle 120 cannot be moved to its depressed position. The handle 120 can only be moved to its depressed position when the implement 104 is in its neutral position.

In this embodiment, the computer of the board 190 is also programmed to determine, on the basis of the same measurements of the sensors, whether the handle 120 is in its released position or in its depressed position. The released or depressed position of the handle 120 is then transmitted to an external control device.

The operation of the interface 184 is deduced from the explanations provided in the case of the interface 100, except that in this case the implement 104 also can be moved between the released position and the depressed position.

FIGS. 8 and 9 show an interface 200 identical to the interface 184, except that the rocker 188 is replaced by a magnetic rocker 204. The rocker 204 is identical to the rocker 188, except that the washer 150 and the leaf spring 178 are replaced by one and the same magnetic part that fulfils both the functions of the washer 150 and of the leaf spring 178. For example, the rocker 204 is identical to the cup 178 except that its circular periphery 180 is replaced by a wider circular periphery 210. The circular periphery 210 extends into the rest position up to the lower face of the magnet 130 and is therefore facing this lower face of the ring 130. In addition, the rocker 204 is entirely made of a non-permanently magnetized magnetic material. Hence, in the rest position of the rocker 204, as shown in FIGS. 8 and 9, the circular periphery 210 is adhered to the lower face of the ring 130.

The operation of the interface 200 is identical to that of the interface 184, except that the rocker 204 is formed from only a single block of material.

Figure 10:
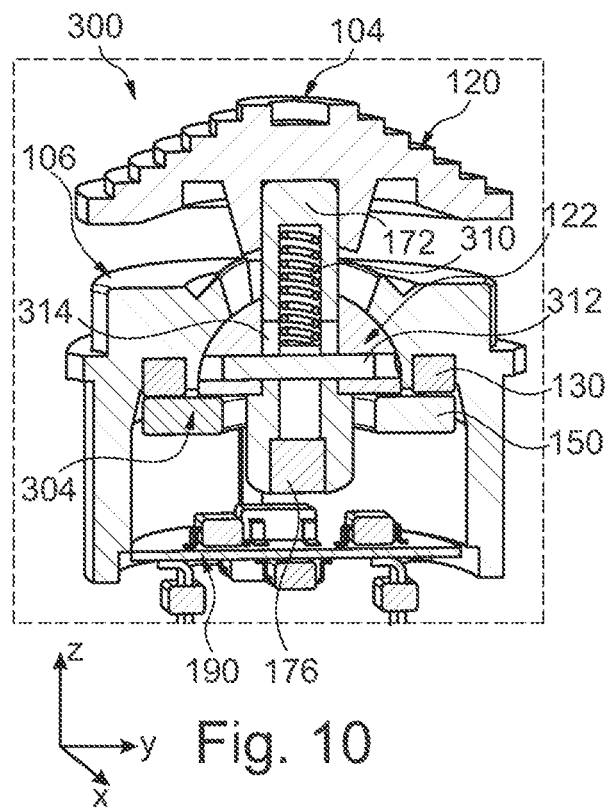
FIGS. 10 and 11 are schematic illustrations, as perspective and vertical section views, of a fourth embodiment of a human-machine interface.
Figure 11:
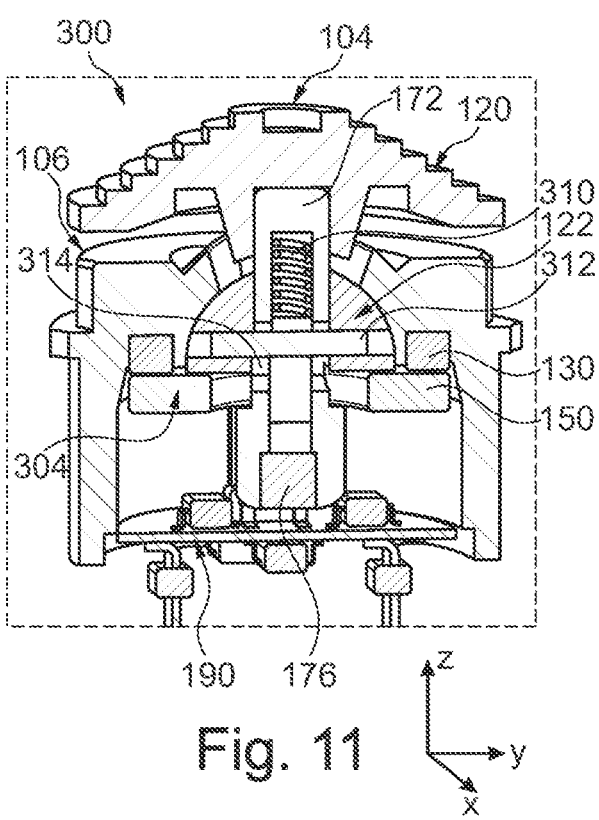

FIGS. 10 and 11 show an interface 300 identical to the interface 184, except that the rocker 188 is replaced by a magnetic rocker 304. The rocker 304 is identical to the rocker 188, except that the leaf spring 178 is omitted. Under these conditions, in order to return the handle 120 to its released position, the interface 300 comprises a helical spring 310. An upper end of the spring 310 is directly in abutment on the shaft 172 and a lower end of the spring 310 is in abutment on a keyway 312. The keyway 312 is attached to the body 122 without any degree of freedom and passes through a horizontal hole 314 completely passing through the shaft 172. In this case, the spring 310 is received inside a hollow tubular housing arranged inside the shaft 172.

The spring 310 constantly pushes the handle 120 back to its released position shown in FIG. 10. The amplitude of this force is identical to the amplitude of the force $F_p$ described in the case of the interface 184.

When the user applies a downward vertical force with an amplitude ranging between the amplitudes of the forces $F_p$ and $F_r$, the handle 120 moves, against the return force of the spring 310, to its depressed position shown in FIG. 11. The remainder of the operation of the interface 300 is identical to the operation of the interface 100.

Figure 12:
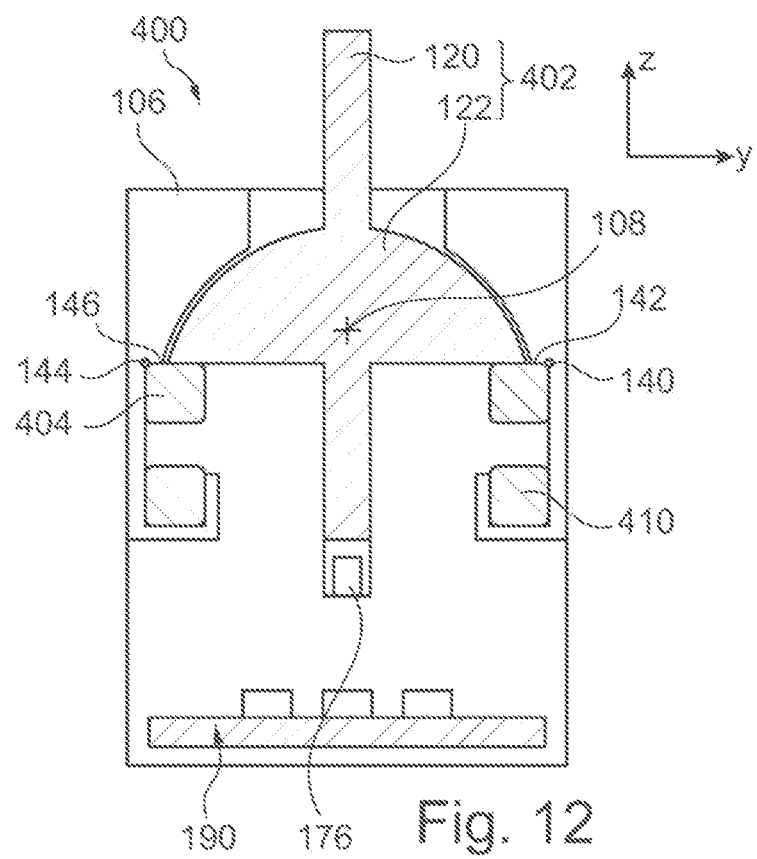
FIG. 12 is a schematic illustration, as a vertical section view, of a fifth embodiment of a human-machine interface.

FIG. 12 shows an interface 400 identical to the interface 100, except that:
  the implement 104 is replaced by an implement 402;
  the magnetic rocker 134 is replaced by a magnetic rocker 404;
  the magnetic assembly attached to the frame 106 is arranged to constantly push the rocker 404 back to its rest position shown in FIG. 12.

The implement 402 is identical to the implement 104, except that the shaft 172 and the body 122 are formed from the same block of material. Thus, in this embodiment, this handle 120 cannot be moved between a released position and a depressed position by exerting a downward vertical force on the handle 120 with an amplitude ranging between the amplitudes of the forces $F_p$ and $F_r$.

The rocker 404 is in the form of a magnetized ring. For example, the rocker 404 is identical to the ring 130. Its north pole faces upward and its south pole faces downward.

The magnetic assembly is arranged to push the rocker 404 upward and therefore to its rest position. To this end, the magnetic assembly comprises a magnetized ring 410 attached to the frame 106 without any degree of freedom and located below the rocker 404. Like the rocker 404, the ring 410 extends mainly horizontally. The axis of rotation of the ring 410 is vertical and coincides with the axis of rotation of the rocker 404. The ring 410 is, for example, structurally identical to the rocker 404, except that its south pole faces upward. The south pole of the ring 410 is, therefore, opposite the south pole of the rocker 404. Under these conditions, the ring 410 constantly pushes the rocker 404 to its rest position.

In this embodiment, the rocker 404 and the ring 410 cooperate in order to generate a return force with an amplitude that increases as the implement 104 inclines rightward or leftward. The remainder of the operation of the interface 400 is deduced from the previously provided explanations in the case of the interface 100, for example.

Figure 13:
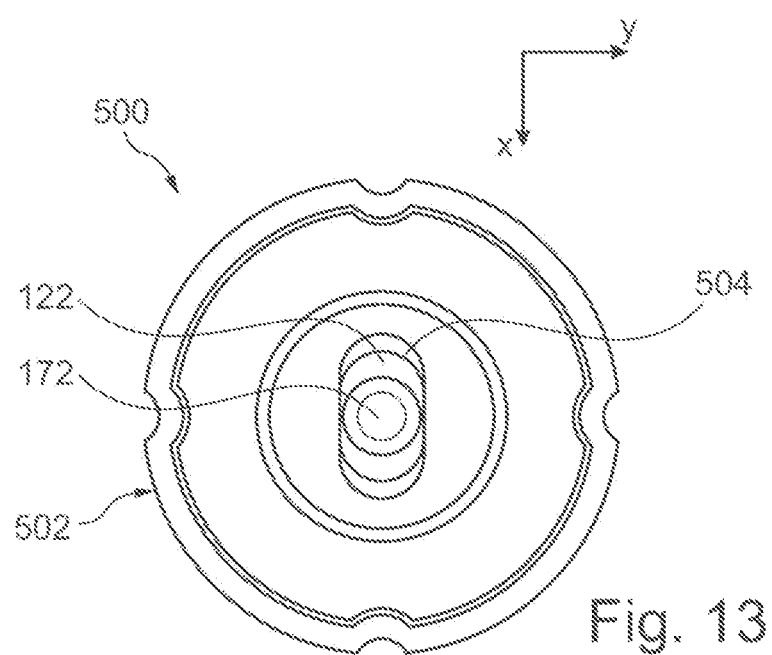
FIG. 13 is a schematic illustration, as a top view, of a portion of a sixth embodiment of a human-machine interface.

FIG. 13 shows an interface 500 identical to the interface 100, except that the only axis about which the implement 104 can pivot is the axis 116. To this end, the frame 106 is replaced by a frame 502. The frame 502 is identical to the frame 106, except that its upper face is shaped in order to prevent any rotational movement of the implement 104 except about the axis 116. In order to simplify this FIG. 13, only a portion of the upper face of the frame 502 and the shaft 172 are shown. To this end, the upper face of the frame 502 comprises a rectilinear slot 504 that translationally guides the shaft 172. This slot extends in the Y-direction.

Figure 14:
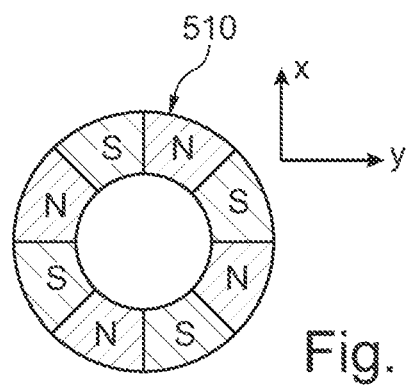
FIG. 14 is a schematic illustration, as a bottom view, of a magnetized ring capable of being used in the second, third, fourth and seventh embodiments of a human-machine interface.

FIG. 14 shows a magnetized ring 510 capable of being used instead of the ring 130 in the interface 100. This ring 510 has, on the horizontal lower face thereof, several south poles and several north poles. In FIG. 14, the south poles and the north poles are denoted using the letters "S" and "N," respectively. The north and south poles of the ring 510 are juxtaposed with one another and are arranged immediately one after the other along the lower face of this ring 510. Each south pole is wedged and inserted between two north poles.

The operation of the interface 100 in which the ring 130 is replaced by the ring 510 is identical to that described in the case whereby the ring 130 is used. However, the field lines of the ring 510 loop back more quickly by means of the washer 150. These field lines are therefore shorter than in the case whereby the ring 130 is used. This reduces the risk of disrupting the operation of an electronic component located in the vicinity of the ring 510.

Figure 15:
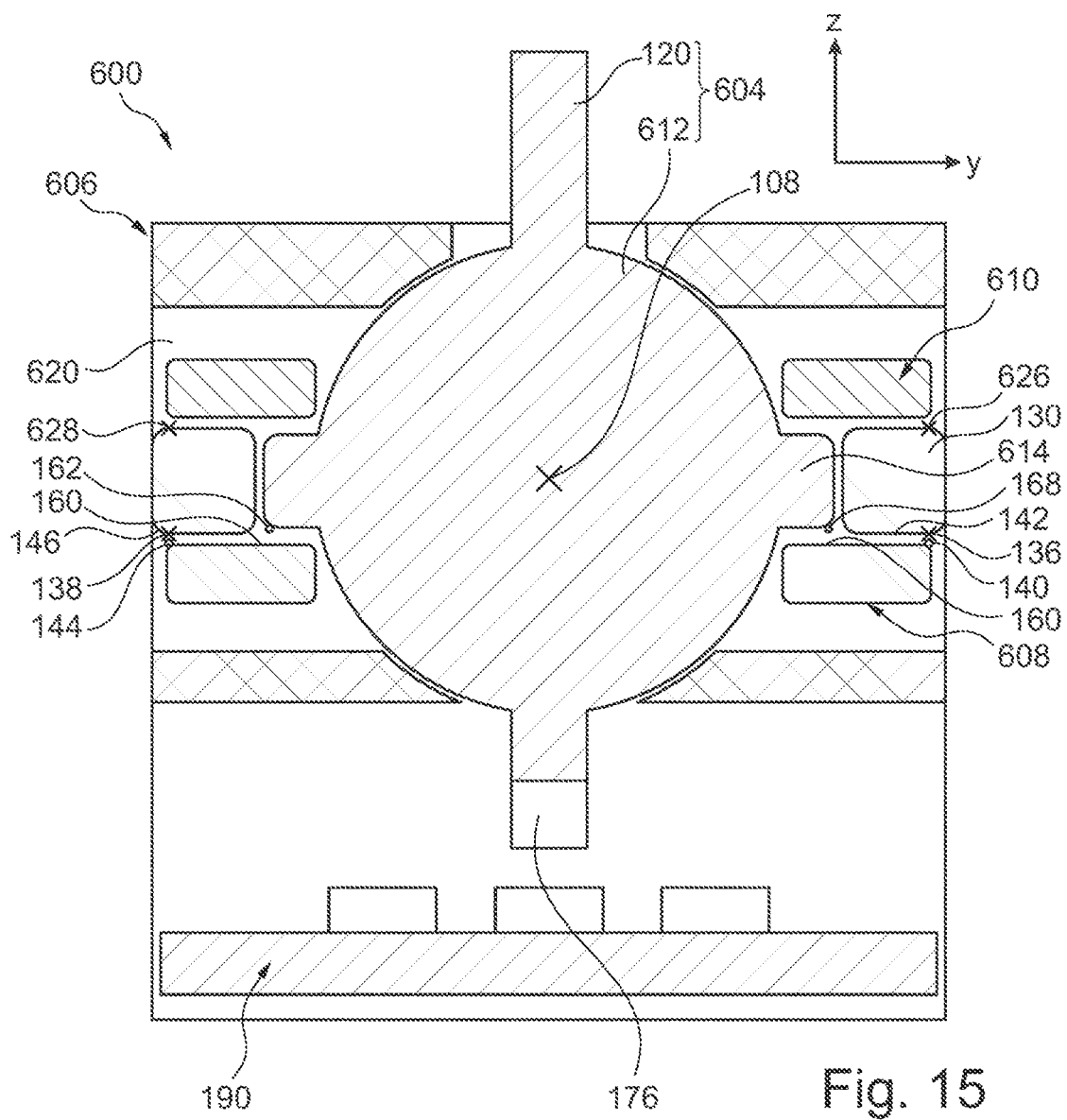
FIG. 15 is a schematic illustration, as a vertical section view, of a seventh embodiment of a human-machine interface.

FIG. 15 shows an interface 600 identical to the interface 100, except that:
  the implement 104 is replaced by an implement 604;
  the frame 106 is replaced by a frame 606; and
  the magnetic rocker 134 is replaced by two magnetic rockers 608 and 610.

The implement 604 is identical to the implement 104, except that the hemispherical body 122 is replaced by a basically spherical body 612. The body 612 forms the male part of a ball-joint connection between the implement 604 and the frame 606. Furthermore, the body 612 comprises a circular shoulder 614, which completely surrounds its spherical part. In the neutral position, the shoulder 614 extends in a horizontal plane. In the neutral position, the shoulder 614 is symmetrical relative to a horizontal plane passing through the center 108 of rotation. Furthermore, in this embodiment, the rockers 608 and 610 are symmetrical with each other relative to this same horizontal plane. Thus, hereafter, only the elements of the shoulder 614 located below this horizontal plane and only the rocker 608 are described in further detail. The elements of the interface 600 that are located above this horizontal plane are deduced by symmetry.

The shoulder 614 comprises a lower edge that forms the slides 162 and 168 of the sliding connection between the implement 604 and the rocker 608.

In this case, the handle 120 is attached to the body 612 without any degree of freedom. Thus, this handle 120 cannot be moved between a released position and a depressed position by exerting a downward vertical force on the handle 120 with an amplitude ranging between the amplitudes of the forces $F_p$ and $F_r$.

The rocker 608 is identical to the rocker 134. It is moved between right and left tilted positions as already described in the case of the rocker 134. The rocker 610 is identical to the rocker 608, except that it is placed on the other side of the ring 130.

The frame 606 is identical to the frame 106, except that it comprises an additional recess 620 that allows the rocker 610 to move between the rest position shown in FIG. 15 and left and right tilted positions. The left tilted position of the rocker 610 is the image of the left tilted position of the rocker 608 relative to the center 108. Similarly, the right tilted position of the rocker 610 is the image of the right tilted position of the rocker 608 relative to the center 108.

In this embodiment, the rocker 610 functions and moves like the rocker 608, except that it pivots about an axis located, relative to a vertical plane passing through the center 108, on the side opposite the side containing the axis about which the rocker 608 pivots. By way of an illustration, in FIG. 15, the symmetrical axes of the axes 136 and 138 relative to the center 108 respectively use reference numerals 628 and 626. Indeed, when the implement 604 moves to its left tilted position, the shoulder 614 at the same time moves the rockers 608 and 610 to their left tilted positions. Thus, in this embodiment, the return force $F_r$ that returns the implement 604 to its neutral position without any external urging is generated by the ring 130 cooperating with the two rockers 608 and 610. This therefore allows the amplitude of the return force to be doubled.

Chapter II: Alternative Embodiments

Alternative Embodiments of the Return Mechanism

As an alternative embodiment, the rocker 134 or the washer 150 is replaced by a magnetized ring with the same shape and with an upward facing north pole. Similarly, in the interface 200, the rocker 204 can be replaced by a cup that is structurally identical, but permanently magnetized and with an upward facing north pole. In these alternative embodiments, both the magnetic assembly and the magnetic rocker comprise a permanent magnet.

Irrespective of the embodiment, the positions of the permanent magnets and of the non-permanently magnetized magnetic parts can be reversed. For example, the ring 130 can be replaced by a non-permanently magnetized metal washer and the washer 150 can be replaced by a magnetized ring.

In the embodiments described thus far, the magnetic assembly and the magnetic rocker comprise either only permanent magnets or only non-permanently magnetized magnetic parts. However, as an alternative embodiment, each one from among the magnetic assembly and the magnetic rocker can comprise both permanent magnets and non-permanently magnetized magnetic parts.

As an alternative embodiment, the magnetic assembly and/or the magnetic rocker comprise a non-magnetic shim that is inserted, in the neutral position, between the magnetic assembly and the magnetic rocker. This shim therefore introduces, in the neutral position, a space between the magnetic assembly and the magnetic rocker. The larger this space, the more the minimum moment to be exerted to move the implement from its neutral position to one of its inclined positions decreases. Thus, the thickness of this shim allows the amplitude of this minimum moment to be adjusted. The shim can be attached to the frame or to the magnetic rocker or a shim can be attached to the frame and another shim can be attached to the magnetic rocker. In addition, if this shim is made of a flexible material such as an elastomer material, it also allows the clacking noise to be dampened that can occur when the magnetic rocker returns to its rest position.

Other Alternative Embodiments

The implement can assume many different shapes. For example, the implement 4 can be replaced by a thumbwheel that pivots about the axis 10. The implement can also comprise one or more push button(s), each movable between an extended position and a position depressed by a finger of the user when they grip the implement.

In a simplified alternative embodiment, the implement is only movable between the neutral position and the left inclined position. For example, to this end, the frame comprises a stop that prevents any movement of the implement to the right inclined position. In this case, the rocker only rotates about the axis of rotation located on the right. All the elements of the interface that also allow the rocker to rotate about an axis located on the left then can be omitted. In addition, the abutment point located on the right is then systematically in its active position. This abutment point then no longer needs to be moved to its remote position.

The number of horizontal axes about which the implement can pivot can be equal to one, as illustrated in FIGS. 1, 2 and 13, or can be infinite, as illustrated in FIGS. 3 to 12 and 15. This number can also range between these two extreme cases. Thus, the number of horizontal axes about which the implement pivots can be greater than or equal to two and less than or equal to six or four. To this end, for example, the frame is arranged so as to limit the number of horizontal axes of rotation, as was illustrated in the particular case of a single axis of rotation with reference to FIG. 13.

The implement also can be shaped to be moved other than by the hand of the user. For example, as an alternative embodiment, the implement is shaped to be moved by a foot of the user. The implement also can be moved by a robot or the like. Thus, the human-machine interface described herein also can be used in fields other than that of human-machine interfaces. For example, it can be used as an end-of-travel detector or as a sensor of a movement of a mechanical object.

Other embodiments of the sliding connection are possible. For example, in a particular embodiment, the positions of the slide and of the flat spot are reversed. One from among the slide and the flat spot is then attached to the rocker and the other one from among the slide and the flat spot is attached to the implement. In another embodiment, the right and left parts of the sliding connection are not symmetrical to each other. For example, the positions of the slide and of the flat spot are only reversed in the right part of the sliding connection.

The leaf 64 can be replaced by a torsion spring that comprises two ends and a central portion that extends between these two ends. For example, the central portion is wound around the axis 10. In the neutral position, the ends of the torsion spring are in abutment on the flat spots 60 and 66, respectively. These ends slide on these flat spots when the implement 4 is inclined. Thus, these ends form the slides of the sliding connection between the implement and the rocker.

As an alternative embodiment, the magnetic return force, which constantly urges the magnetic rocker to its rest position, is not sufficient in itself, without any external urging, to return the implement from its inclined position to its neutral position. In this case, in addition to the return force generated by the magnetic interaction between the magnetic rocker and the magnetic assembly, one or more spring(s) can be used to constantly urge the implement to its neutral position. For example, to this end, the leaf 64 is replaced by two torsion springs. Each of these torsion springs comprises one end attached to the frame 6 and another end that slides on a respective flat spot 60, 66. Between these two ends, each of these torsion springs comprises a central portion wound around the axis 10 and moved by the implement 4 when it is inclined.

As an alternative embodiment, the sensor of the angular position of the implement comprises a magnetic field sensor that measures the direction of the magnetic moment of the magnetic rocker. In this embodiment, the permanent magnet 176 can be omitted so that the implement can be completely devoid of a magnetic part.

In another embodiment, the magnetic field sensors are replaced by mechanical sensors, such as buttons, which are depressed when the rocker tilts on either side. In this case also, the implement can be devoid of a magnetic part.

As an alternative embodiment, the electronic board 190 does not comprise the electronic computer but, for example, only the magnetic field sensors. Typically, in this case, the electronic computer is transferred to the outside of the human-machine interface.

As an alternative embodiment, the magnetic assembly of the frame used to generate the return force of the implement 4 to its neutral position does not allow the attraction force to be generated that holds the point 40 and, alternately, the point 44 in its active position. For example, in order to hold the points 40 and 44 in their active positions, the frame and the magnetic rocker comprise magnetic parts dedicated to this function. These magnetic parts are then different from those of the magnetic assembly used to generate the return force. For example, the frame or the magnetic rocker comprise additional permanent magnets that generate an attraction force in a horizontal direction parallel to the Y direction that is able to hold one of the abutment points of the rocker in its active position.

As an alternative embodiment, the left and right inclined positions are not symmetrical to each other. Similarly, the left and right tilted positions of the rocker are not necessarily symmetrical to each other.

Chapter III: Advantages of the Described Embodiments

Generating a return force using a permanent magnet allows the spatial requirement of the human-machine interface to be reduced compared with identical human-machine interfaces, but in which the return force is generated using springs such as helical springs.

Using a magnetic rocker independent of the implement limits the number of magnetic parts to be directly attached to the implement. This therefore simplifies the production of the implement. In addition, the tolerances concerning the positioning of the implement relative to the frames also can be increased, since this has no significant influence on the amplitude of the return force.

Since the slides of the sliding connection are offset relative to the axis of rotation of the implement, a non-zero moment exists that needs to be overcome before successfully moving the implement to one of its inclined positions. By virtue of this, the sensitivity of the human-machine interface to vibrations is reduced.

Keeping the abutment points in their active position solely by means of a magnetic attraction force that is exerted between the magnetic assembly and the magnetic rocker simplifies the architecture and the assembly of the human-machine interface.

The fact that the magnetic return force is generated using a permanent magnet and a non-permanently magnetized magnetic part allows the field lines of the permanent magnet to be concentrated inside the magnetic part. This therefore limits the field lines that loop back by passing outside this magnetic part. The risk that the field lines of this permanent magnet can disrupt an electronic component located close to the permanent magnet is therefore reduced.

Using pairs of permanent magnets arranged side by side, so as to adhere each south pole of a permanent magnet to a north pole of another permanent magnet, allows field lines to be obtained that loop back more quickly and that are therefore shorter. This also limits the risk that the field lines of this group of permanent magnets can disrupt the operation of electronic components located in the vicinity.

The fact that the magnetic poles facing the magnetic assembly and the magnetic rocker have opposite polarity allows a return force to be generated that decreases as the implement moves to any one of its inclined positions.

Conversely, the fact that the magnetic poles facing the magnetic assembly and the magnetic rocker have the same polarity allows a return force to be generated that increases as the implement moves to any one of its inclined positions.

The invention claimed is:

1. A human-machine interface comprising:
 a fixed frame;
 an implement rotatably movable by a user in a first direction, about a first axis, from a neutral position to a first inclined position, the neutral position being the position of the implement without any external urging of this implement;
 a return mechanism, which constantly urges the implement to its neutral position, this return mechanism comprising a magnetic assembly comprising one or more magnetic part(s) each attached to the frame,
 wherein:
 the return mechanism comprises:
  a magnetic rocker rotatably movable in the first direction, about a second axis, from a rest position, in which it holds the implement in its neutral position, to a first tilted position, in which the implement is in its first inclined position, the second axis being separate and parallel to the first axis, with one from among the magnetic assembly and the magnetic rocker comprising a group of one or more permanent magnet(s), this group of permanent magnets being capable of cooperating with the other one of this magnetic assembly and of the magnetic rocker in order to generate a magnetic return force that constantly urges the magnetic rocker to its rest position;
  a sliding connection capable of converting the rotational movement of the implement in the first direction into a rotational movement in the first direction of the rocker, with this sliding connection to this end comprising:
   a first flat spot entirely located on one side of a median plane containing the first axis; and
   a first slide located at least 1 mm from the first axis and capable of coming into abutment on the first flat spot in order to slide along the first flat spot when the implement moves between its neutral position and its first inclined position;

the implement comprises one from among this first slide and the first flat spot, and the magnetic rocker comprises the other one from among this first slide and the first flat spot so that this sliding connection is capable of converting the movement of the implement to the first inclined position into a movement of the magnetic rocker to its first tilted position and of converting the movement of the magnetic rocker to its rest position into a movement of the implement to its neutral position, wherein:
the frame comprises a first stop located at the site of the second axis;
the magnetic rocker comprises a first abutment point that is movable between:
an active position, in which it is in abutment on the first stop in order to form, by cooperation of shapes with this first stop, a first articulation, which allows the rocker to rotate about the second axis when the implement is moved between its neutral position and its first inclined position; and
a remote position, in which the first abutment point is remote from the first stop;
the group of permanent magnets or another group of one or more permanent magnet(s) is capable of generating a magnetic attraction force that holds the first abutment point in its active position as long as the magnetic rocker is moved between its neutral position and its first tilted position.

2. The interface as claimed in claim 1, wherein only one from among the magnetic assembly and the magnetic rocker comprises the group of permanent magnets, the other one from among the magnetic assembly and the magnetic rocker comprises only one group of one or more magnetic part(s) capable, by cooperating with the group of permanent magnets, of generating the magnetic return force.

3. The interface as claimed in claim 2, wherein:
the group of permanent magnets comprises a south pole and a north pole directly juxtaposed with one another; and
the juxtaposed south pole and north pole are both facing one of the magnetic parts of the group of magnetic parts.

4. The interface as claimed in claim 1, wherein:
the implement comprises:
a body rotatably mounted about the first axis, this body comprising:
the first slide and the first flat spot that is included in the implement; and
a casing;
a pusher, which is movable, by the user, by sliding inside the casing, between a released position and a depressed position;
the magnetic rocker comprises a leaf spring, which constantly exerts a force on the pusher that pushes it to its released position, the amplitude of this force being less than the amplitude of the magnetic return force generated when the magnetic rocker is in its rest position.

5. The interface as claimed in claim 4, wherein the leaf spring is made of a magnetic material and also cooperates with the magnetic assembly of the frame in order to generate the magnetic return force.

6. The interface as claimed in claim 1, wherein:
the magnetic assembly comprises a first magnetic pole facing the magnetic rocker; and
the magnetic rocker comprises a second magnetic pole, opposite the first magnetic pole and having the same polarity as the first magnetic pole, so that the first and second poles repel each other.

7. The interface as claimed in claim 1, wherein:
the magnetic assembly comprises a first magnetic pole facing the magnetic rocker; and
the magnetic rocker comprises a second magnetic pole facing the first magnetic pole and having opposite polarity to the polarity of the first magnetic pole, so that this second magnetic pole is attracted by the first magnetic pole.

8. The interface as claimed in claim 1, wherein:
the implement is rotatably movable, by the user, in a second direction opposite to the first direction, about the first axis from the neutral position to a second inclined position;
the magnetic rocker is rotatably movable in the second direction about a third axis of rotation from its rest position to a second tilted position, in which the implement is in its second inclined position, the third axis being separate and parallel to the first axis and located, relative to the median plane, on a side opposite to the side where the second axis is located;
the sliding connection comprises:
a second flat spot entirely located on one side of the median plane opposite to the side where the first flat spot is located; and
a second slide located more than 1 mm from the first axis and capable of coming into abutment on the second flat spot in order to slide along the second flat spot when the implement moves between its neutral position and its second inclined position;
the implement comprises one from among this second slide and the second flat spot and the magnetic rocker comprises the other one from among this second slide and the second flat spot, so that this sliding connection is capable of converting the movement of the implement to the second inclined position into a movement of the magnetic rocker to its second inclined position and of converting the movement of the magnetic rocker from its second inclined position to its rest position into a movement of the implement from its second inclined position to its neutral position.

9. The interface as claimed in claim 8, wherein:
the frame comprises a second stop located at the site of the third axis;
the magnetic rocker comprises a second abutment point movable between:
an active position, in which it is in abutment on the second stop in order to form, by cooperation of shapes with this second stop, a second articulation that allows the magnetic rocker to rotate about the third axis when the implement is moved from its neutral position to its second inclined position; and
a remote position, in which the second abutment point is remote from the second stop when the implement is moved from its neutral position to its first inclined position;
the group of permanent magnets or another group of one or more permanent magnet(s) is capable of generating a magnetic attraction force that holds the second abutment point in its active position as long as the magnetic rocker is moved between its neutral position and its second tilted position.

10. The interface as claimed in claim 1, wherein the distance between the first axis and the first slide is greater than 3 mm.

11. The interface as claimed in claim 1, wherein the implement is only rotatable about one or more axes that all pass through the same fixed point relative to the frame.

12. The interface as claimed in claim 1, wherein, without any external urging, the magnetic return force in itself is sufficient for returning the implement from its first inclined position to its neutral position.

* * * * *

UNITED STATES PATENT AND TRADEMARK OFFICE
CERTIFICATE OF CORRECTION

PATENT NO. : 12,013,717 B2
APPLICATION NO. : 17/995382
DATED : June 18, 2024
INVENTOR(S) : Damien Beurdeley et al.

Page 1 of 1

It is certified that error appears in the above-identified patent and that said Letters Patent is hereby corrected as shown below:

In the Specification

Column 3, Line 21, change "2° and 500 or" to --2° and 50° or--
Column 6, Line 32, change "210 and 45° or" to --21° and 45° or--

Signed and Sealed this
Seventeenth Day of December, 2024

Derrick Brent
*Acting Director of the United States Patent and Trademark Office*